Figure 1:
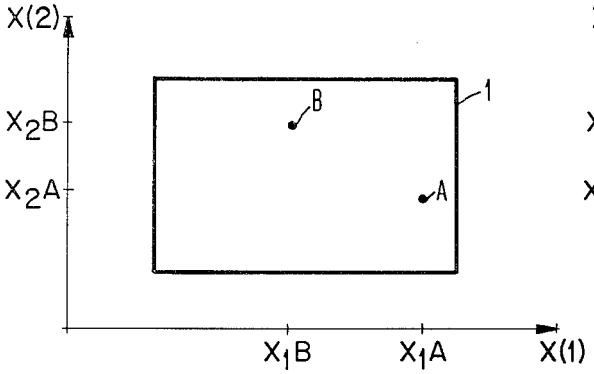
Figure 2:
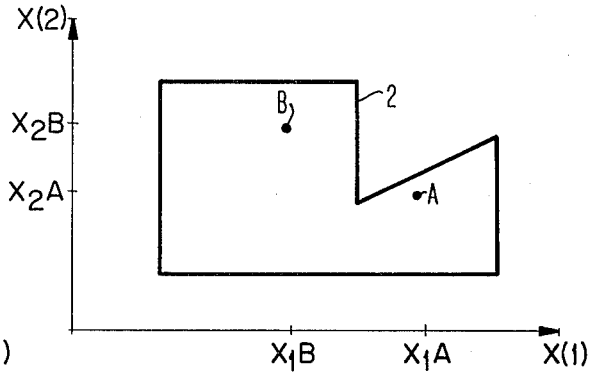
Figure 3:
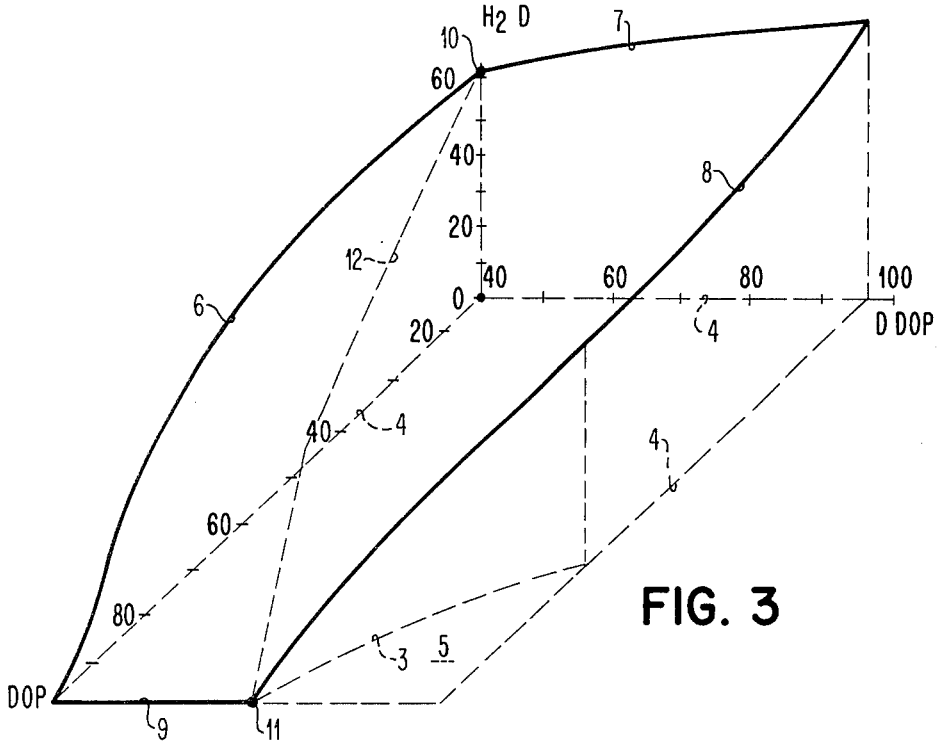
Figure 4:
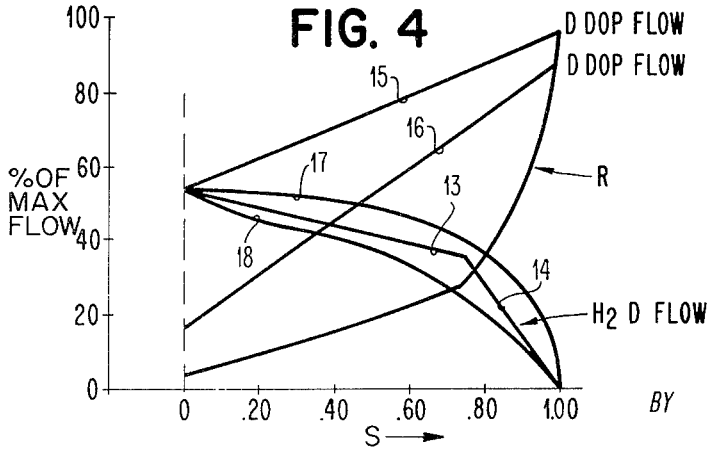
Figures 5, 5A:
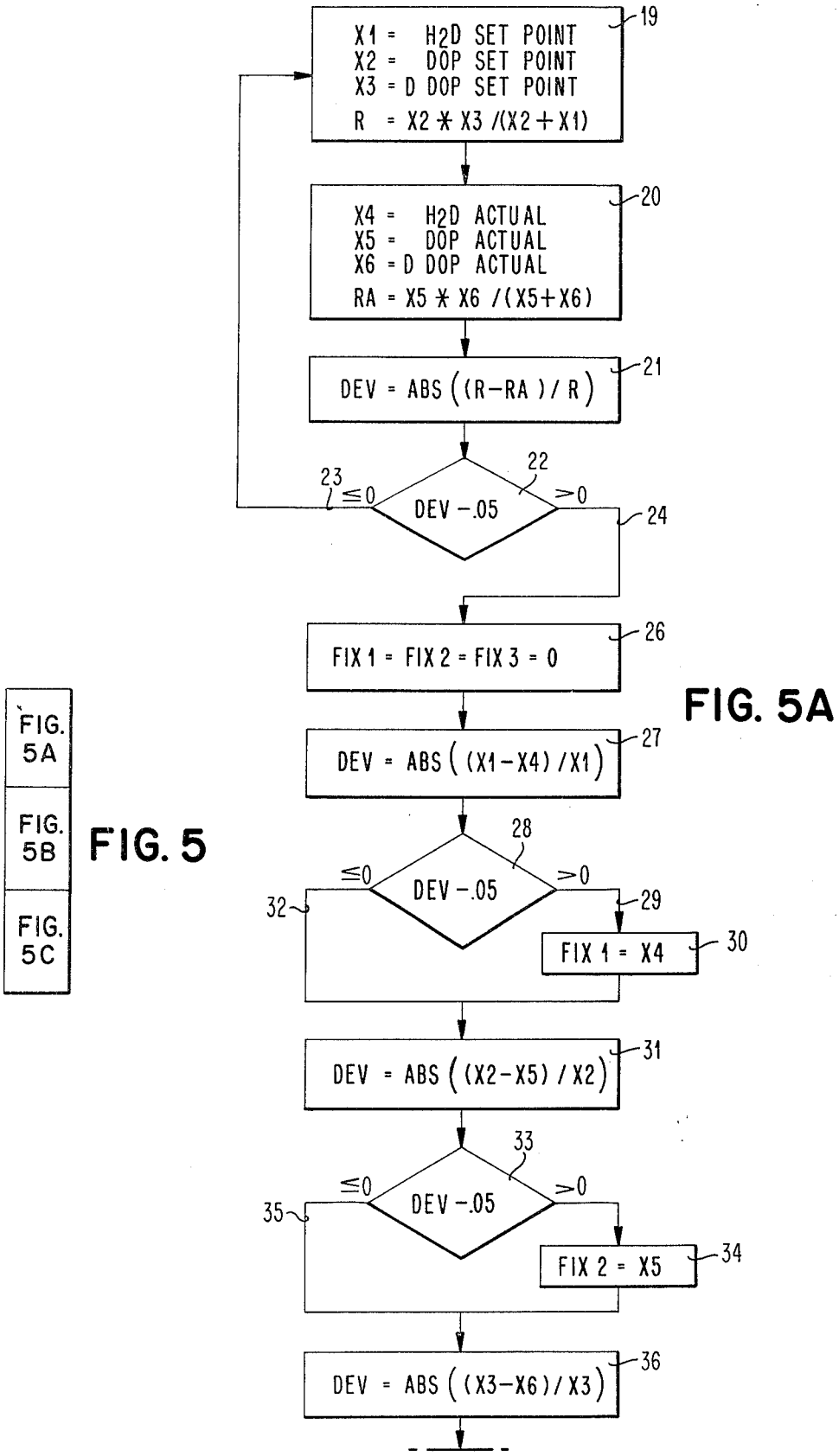
Figure 5B:
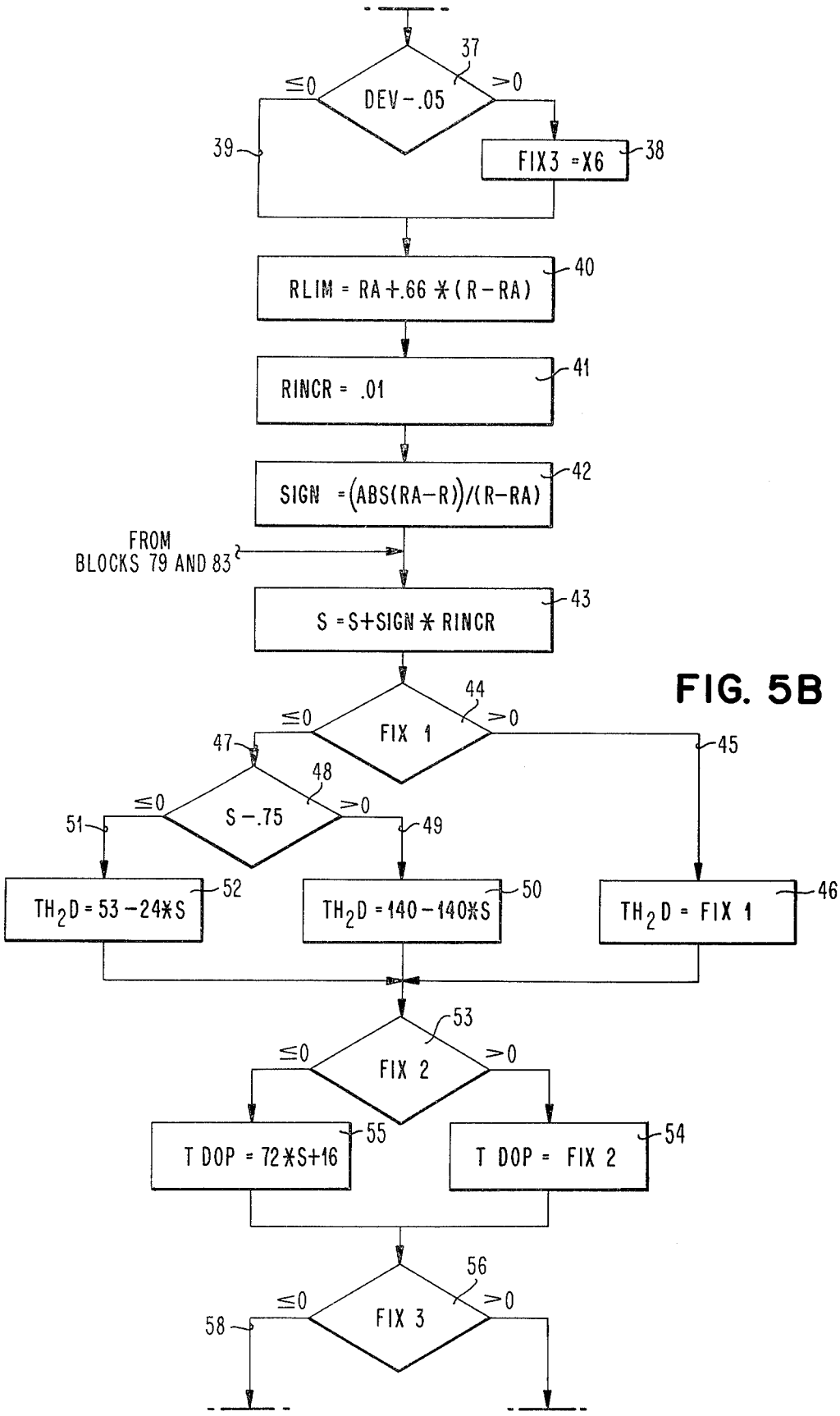
Figure 5C:
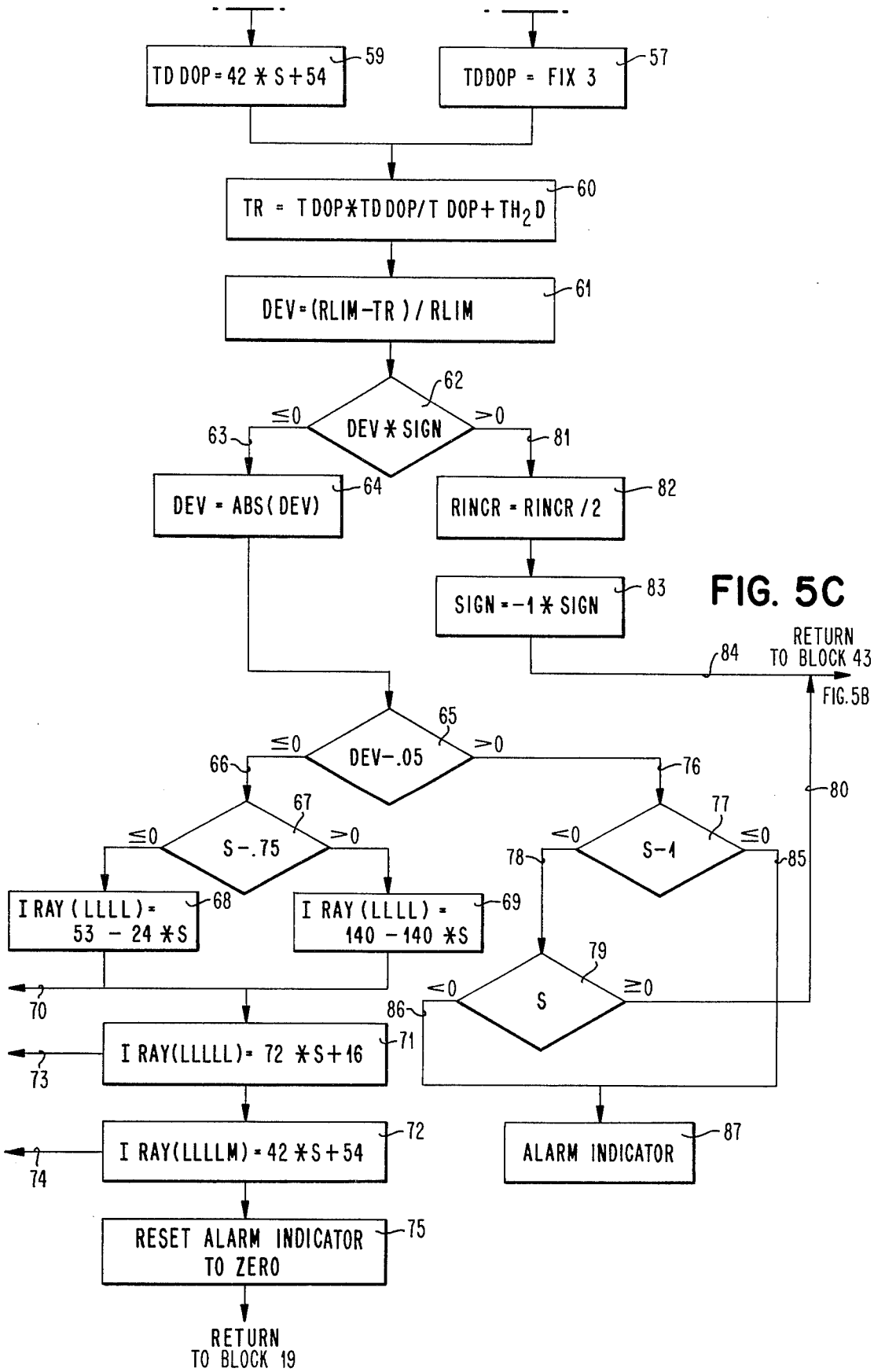

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MAY 6, 1975

934 OG 8

T934,006

COMPUTER CONTROL FOR REAL TIME DETERMINATION OF RESISTIVITY OF EPITAXIALLY GROWING CRYSTALS

Ronald E. Chappelow, Wappingers Falls, Leo E. Elijah, Beacon, Virgil L. Elliott, Newburgh, Edward G. Grochowski, Wappingers Falls, Harry D. Harrison, Beacon, Homer A. Tice, Hyde Park, and Ralph S. York, Wappingers Falls, N.Y., assignors to International Business Machines Corporation, Armonk, N.Y.

Continuation of application Ser. No. 97,235, Dec. 11, 1970. This application Nov. 19, 1973, Ser. No. 416,893

Int. Cl. G06f *15/46*

U.S. Cl. 235—151.1

4 Sheets Drawing. 29 Pages Specification

Method for the real-time control of the resistivity of an epitaxially growing crystal by a specially programmed process control computer. The diluent hydrogen, the arsenic dopant and the diluted arsenic dopant gas flow rates of a silicon tetrachloride-arsine reaction system are controlled simultaneously toward values determined in accordance with respective monotonic functions of a parameter S satisfying the relationships between the aforesaid three gas flow rates and the resistivity value of the epitaxial layer. The actual gas flow rates are monitored at predetermined intervals during epitaxial growth and a computed resistivity function R thereof is compared to the same computed function based upon desired gas flow rates. Any deviation in excess of a preestablished amount causes the computer to increment the value of the parameter S until a new realizable combination of gas flow rate values is found which would restore the desired resistivity value of the growing epitaxial layer.

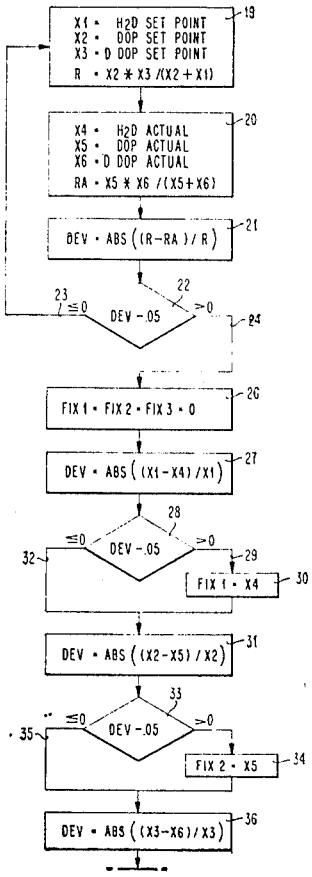

INVENTORS
RONALD E. CHAPPELOW
LEO M. ELIJAH
VIRGIL L. ELLIOTT
EDWARD G. GROCHOWSKI
HARRY D. HARRISON
HOMER A. TICE
RALPH S. YORK
BY Robert J. Haase
ATTORNEY